United States Patent
Heineck et al.

(10) Patent No.: US 9,036,391 B2
(45) Date of Patent: May 19, 2015

(54) ARRAYS OF VERTICALLY-ORIENTED TRANSISTORS, MEMORY ARRAYS INCLUDING VERTICALLY-ORIENTED TRANSISTORS, AND MEMORY CELLS

(75) Inventors: Lars P. Heineck, Garden City, ID (US); Jonathan T. Doebler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 13/413,402

(22) Filed: Mar. 6, 2012

(65) Prior Publication Data

US 2013/0235642 A1 Sep. 12, 2013

(51) Int. Cl.
*H01L 27/00* (2006.01)

(52) U.S. Cl.
CPC ................................ *H01L 27/00* (2013.01)

(58) Field of Classification Search
CPC ....................................................... H01L 27/00
USPC .............................................................. 365/72
See application file for complete search history.

(56) References Cited

U.S. PATENT DOCUMENTS

| | | |
|---|---|---|
| 3,562,022 A | 2/1971 | Shifrin |
| 3,865,624 A | 2/1975 | Wilde |
| 4,673,962 A | 6/1987 | Chatterjee et al. |
| 4,764,394 A | 8/1988 | Conrad |
| 4,920,390 A | 4/1990 | Fuse et al. |
| 5,374,456 A | 12/1994 | Matossian et al. |
| 5,508,212 A | 4/1996 | Wang et al. |
| 5,627,390 A | 5/1997 | Maeda et al. |
| 5,672,541 A | 9/1997 | Booske et al. |
| 5,828,094 A | 10/1998 | Lee |
| 6,137,713 A | 10/2000 | Kuroda et al. |
| 6,225,151 B1 | 5/2001 | Gardner et al. |
| 6,329,686 B1 | 12/2001 | Lowrey et al. |
| 6,417,040 B2 | 7/2002 | Noble |
| 6,492,245 B1 | 12/2002 | Liu et al. |
| 6,504,201 B1 | 1/2003 | Noble et al. |
| 6,563,162 B2 | 5/2003 | Han et al. |
| 6,582,998 B2 | 6/2003 | Nitta |
| 6,593,612 B2 | 7/2003 | Gruening et al. |
| 6,600,191 B2 | 7/2003 | Lowrey et al. |
| 6,639,846 B2 | 10/2003 | Nikutta |

(Continued)

FOREIGN PATENT DOCUMENTS

| | | |
|---|---|---|
| KR | 10-2004-0055142 | 6/2004 |
| WO | PCT/US2013/051622 | 11/2013 |

OTHER PUBLICATIONS

U.S. Appl. No. 12/914,346, filed Nov. 1, 2010, Heineck et al.

(Continued)

*Primary Examiner* — Hoai V Ho
*Assistant Examiner* — Min Huang
(74) *Attorney, Agent, or Firm* — Wells St. John, P.S.

(57) ABSTRACT

An array includes a plurality of vertically-oriented transistors, rows of access lines, and columns of data/sense lines. Individual of the rows include an access line interconnecting transistors in that row. Individual of the columns include an inner data/sense line elevationally inward of the access lines and which interconnect transistors in that column. An outer data/sense line is elevationally outward of the access lines and electrically couples to the inner data/sense line. Other embodiments are disclosed, including memory arrays and memory cells.

28 Claims, 4 Drawing Sheets

(56) References Cited

U.S. PATENT DOCUMENTS

| | | |
|---|---|---|
| 6,689,660 B1 | 2/2004 | Noble et al. |
| 6,716,727 B2 | 4/2004 | Walther |
| 6,977,417 B2 | 12/2005 | Momiyama et al. |
| 6,992,349 B2 | 1/2006 | Lee et al. |
| 7,015,091 B1 | 3/2006 | Wu |
| 7,052,941 B2 | 5/2006 | Lee |
| 7,074,656 B2 | 7/2006 | Yeo et al. |
| 7,099,174 B2 | 8/2006 | Thompson et al. |
| 7,129,538 B2 | 10/2006 | Lee et al. |
| 7,166,479 B2 | 1/2007 | Zhu et al. |
| 7,179,703 B2 | 2/2007 | Gonzalez et al. |
| 7,365,384 B2 | 4/2008 | Tran et al. |
| 7,456,068 B2 | 11/2008 | Kavalieros et al. |
| 7,491,641 B2 | 2/2009 | Southwick et al. |
| 7,501,676 B2 | 3/2009 | Doyle |
| 7,518,182 B2 | 4/2009 | Abbott et al. |
| 7,592,212 B2 | 9/2009 | Qin et al. |
| 7,713,823 B2 | 5/2010 | Sung et al. |
| 7,736,969 B2 | 6/2010 | Abbott et al. |
| 7,737,010 B2 | 6/2010 | Qin et al. |
| 7,768,073 B2 * | 8/2010 | Wells ............................ 257/374 |
| 7,939,409 B2 | 5/2011 | Figura et al. |
| 7,948,064 B2 | 5/2011 | Barth et al. |
| 7,956,402 B2 | 6/2011 | Chen et al. |
| 8,008,158 B2 | 8/2011 | Chang et al. |
| 2002/0110039 A1 | 8/2002 | Forbes et al. |
| 2003/0096490 A1 | 5/2003 | Borland et al. |
| 2003/0107911 A1 | 6/2003 | Nishihara et al. |
| 2003/0186519 A1 | 10/2003 | Downey et al. |
| 2004/0132232 A1 | 7/2004 | Noble |
| 2004/0195594 A1 | 10/2004 | Tran et al. |
| 2005/0017281 A1 | 1/2005 | Lowrey |
| 2005/0079721 A1 | 4/2005 | Buerger, Jr. et al. |
| 2005/0260838 A1 | 11/2005 | Downey et al. |
| 2006/0017088 A1 | 1/2006 | Abbott et al. |
| 2006/0059449 A1 | 3/2006 | Yang et al. |
| 2006/0081884 A1 | 4/2006 | Abbott et al. |
| 2006/0249770 A1 | 11/2006 | Huo et al. |
| 2007/0087574 A1 | 4/2007 | Gupta et al. |
| 2007/0243680 A1 | 10/2007 | Harhari et al. |
| 2007/0295995 A1 | 12/2007 | Yun et al. |
| 2008/0142931 A1 | 6/2008 | Sasaki et al. |
| 2008/0217655 A1 | 9/2008 | Baumann et al. |
| 2008/0268628 A1 | 10/2008 | Kohli et al. |
| 2008/0277738 A1 | 11/2008 | Ananthan |
| 2009/0121268 A1 * | 5/2009 | Lee et al. ...................... 257/296 |
| 2009/0230466 A1 | 9/2009 | Kim |
| 2009/0256187 A1 | 10/2009 | Kim |
| 2010/0237423 A1 | 9/2010 | Yun et al. |
| 2011/0019486 A1 * | 1/2011 | Jang et al. ................. 365/185.25 |
| 2011/0215391 A1 * | 9/2011 | Takaishi ........................ 257/306 |
| 2011/0215408 A1 | 9/2011 | Tang et al. |
| 2011/0220994 A1 | 9/2011 | Parekh et al. |
| 2013/0168757 A1 * | 7/2013 | Hong ............................ 257/324 |

OTHER PUBLICATIONS

U.S. Appl. No. 13/031,829, filed Feb. 22, 2011, Guha et al.

Bernstein et al., Effects of Dopant Deposition on p+/n and n+/p Shallow Junctions formed by Plasma Immersion Ion Implanation, IEEE, 2000, 464-467.

Gras-Marti, "Recoil Implanatation Yields and Depth Profiles", Phys. Stat. Sol. (1) 76, 621-627, 1983.

Oh et al.; Characterization of B2H6 Plasma Doping for Converted p+ Poly-Si Gate, 2006 American Institute of Physics, pp. 25-28.

Qin et al.; Comparative Study of Self-Sputtering Effects of Different Boron-Based Low-Energy Doping Techniques, 2009 IEEE, vol. 37, No. 9, Sep. 2009, pp. 1760-1766.

Dopant Diffusion in C-Doped and Si and SiGe: Physical Model and Experimental Verification; Rucker et. al.; Institute for Semiconductor Physics; 1999; 4 pp.

* cited by examiner

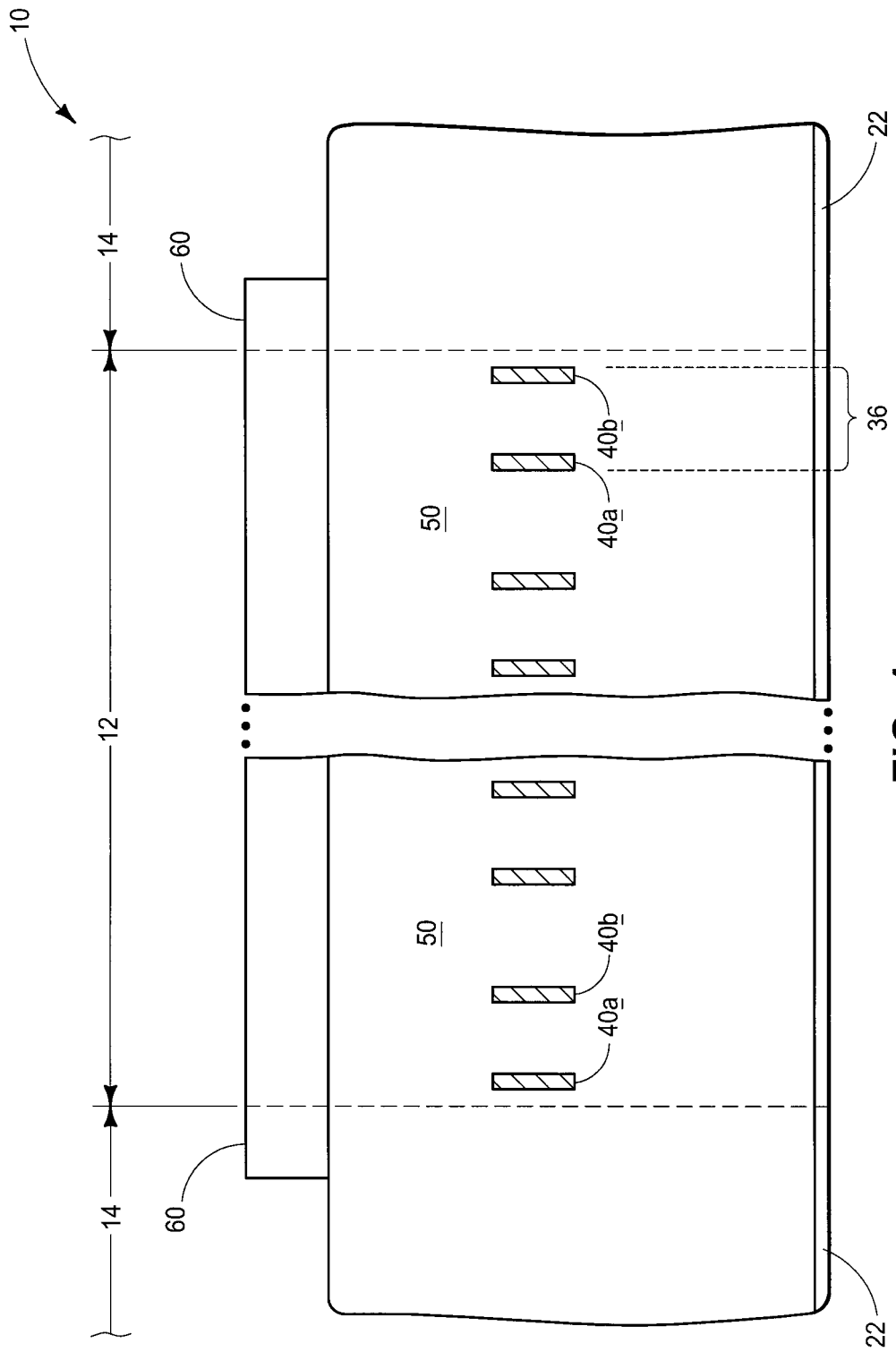

ARRAYS OF VERTICALLY-ORIENTED TRANSISTORS, MEMORY ARRAYS INCLUDING VERTICALLY-ORIENTED TRANSISTORS, AND MEMORY CELLS

TECHNICAL FIELD

Embodiments disclosed herein pertain to arrays of vertically-oriented transistors, to memory arrays that include vertically-oriented transistors, and to memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The digit lines may electrically interconnect memory cells along columns of the array, and the access lines may electrically interconnect memory cells along rows of the array. Each memory cell may be uniquely addressed through the combination of a digit line and an access line.

Memory cells may be volatile or nonvolatile. Nonvolatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin dielectric. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Transistors other than field-effect transistors, for example bipolar transistors, may additionally or alternately be used in memory cells.

One type of volatile memory is dynamic random access memory (DRAM). Some DRAM memory cells may comprise a field effect transistor coupled with a charge-storage device, such as a capacitor. Other example memory cells may lack capacitors, and instead may utilize electrically floating transistor bodies. Memory which utilizes electrically floating transistor bodies to store data may be referred to as zero-capacitor-one-transistor (0C1T) memory, as capacitor-less memory, or as ZRAM™ (zero capacitance DRAM), and may be formed to much higher levels of integration than DRAM.

The gates of the transistors may interconnect along rows of the memory cells and form the access lines. The digit or data/sense lines may interconnect with one of the source/drains of each transistor along columns of the memory cells. The data/sense lines may connect with individual sense amplifiers outside of the memory array. Access lines and data/sense lines may be used in memory arrays wherein the individual memory cells include transistors in addition to or other than field effect transistor. Regardless, it is desirable that the data/sense lines be of high conductivity.

Transistors may be used in memory other than DRAM and in other than volatile memory. Further, transistors may be formed in arrays other than memory.

BRIEF DESCRIPTION OF THE DRAWINGS

FIG. 4 is a structural cross-section view of the substrate fragment of FIG. 1, and taken through line 4-4 in FIG. 1.

DETAILED DESCRIPTION OF EXAMPLE EMBODIMENTS

Figure 1:
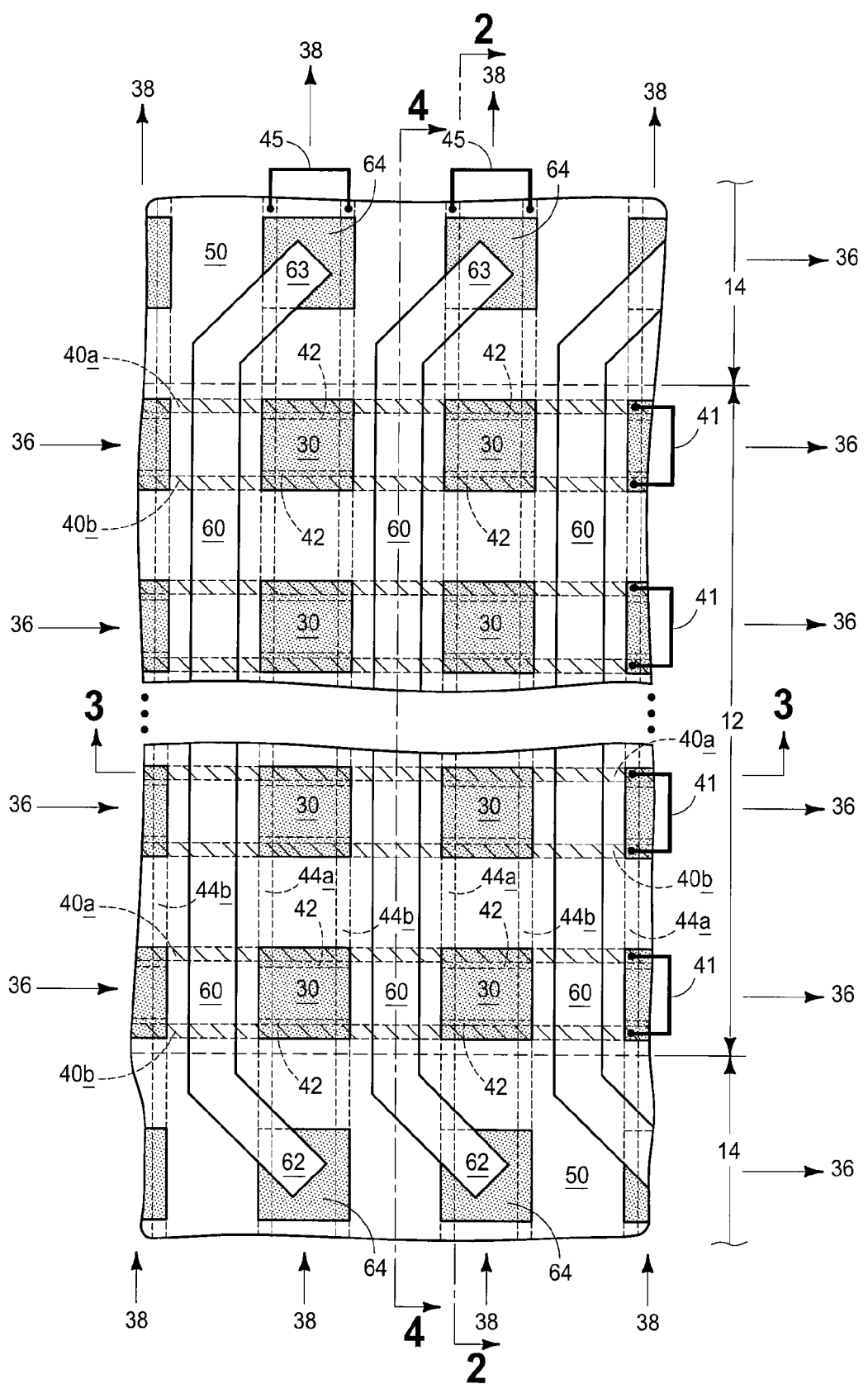
FIG. 1 is a diagrammatic, fragmented, top plan view of a substrate fragment comprising an array in accordance with an embodiment of the invention, and which comprises a plurality of vertically-oriented transistors.

Embodiments of the invention encompass arrays of vertically-oriented transistors, memory arrays including vertically-oriented transistors, and memory cells which include a vertically-oriented transistor. Example embodiments are described with reference to FIGS. 1-4. Such depicts a substrate fragment 10, for example a semiconductor substrate, comprising an array or sub-array area 12 and circuitry area 14 peripheral to array/sub-array area 12. Array area 12 includes an array of vertically-oriented transistors 16. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three-dimensional space. Further in this document, "elevational" and "elevationally" are with reference to the vertical direction relative to a base substrate upon which the circuitry has been fabricated. Circuitry may be fabricated outside of array area 12 (i.e., in area 14) for operating vertically-oriented transistors 16. Control and/or other peripheral circuitry for operating vertically-oriented transistors 16 within the array may or may not wholly or partially be received within array area 12, with an example array area as a minimum encompassing all of the vertically-oriented transistors (e.g., which may include memory cells) of a given array/sub-array. Further, multiple sub-arrays might also be fabricated and operated independently, in tandem, or otherwise relative one another. As used in this document, a "sub-array" may also be considered as an array.

In some embodiments, the array area comprises memory, for example comprising a plurality of individual memory cells which include a generally vertically-oriented transistor. One example is DRAM, although other existing or yet-to-be-developed volatile and non-volatile memory is contemplated. FIGS. 1-4 by way of example depict array area 12 as comprising a plurality of memory cells 18 which individually include a transistor 16 and a charge storage device 15 (shown schematically in FIGS. 2 and 3). Charge storage device 15 is shown as being a capacitor, although other storage devices or techniques may be used and which may be formed within and/or above substrate fragment 10.

Figure 2:
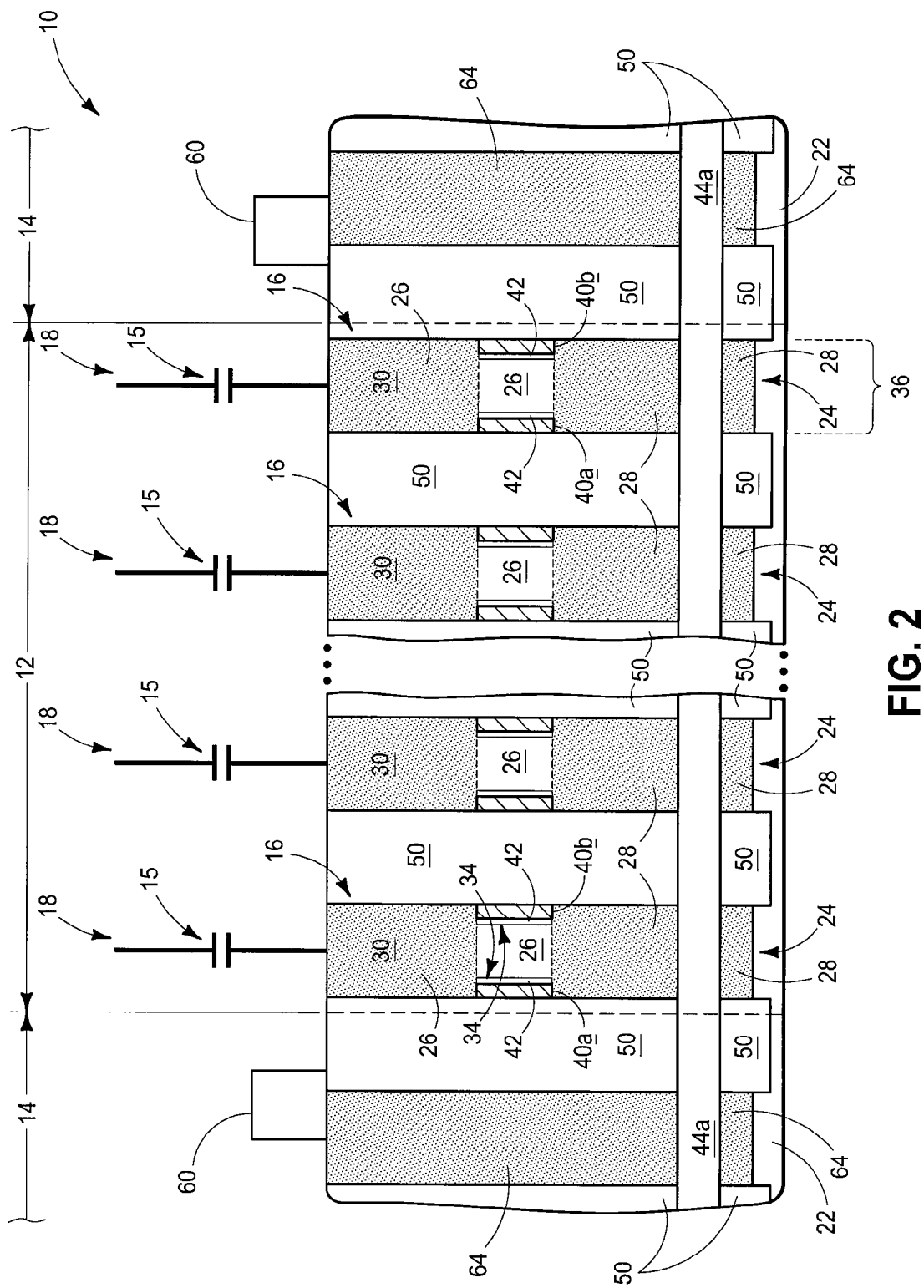
FIG. 2 is a hybrid schematic and structural cross-section view of the substrate fragment of FIG. 1, and taken through line 2-2 in FIG. 1.
Figure 3:
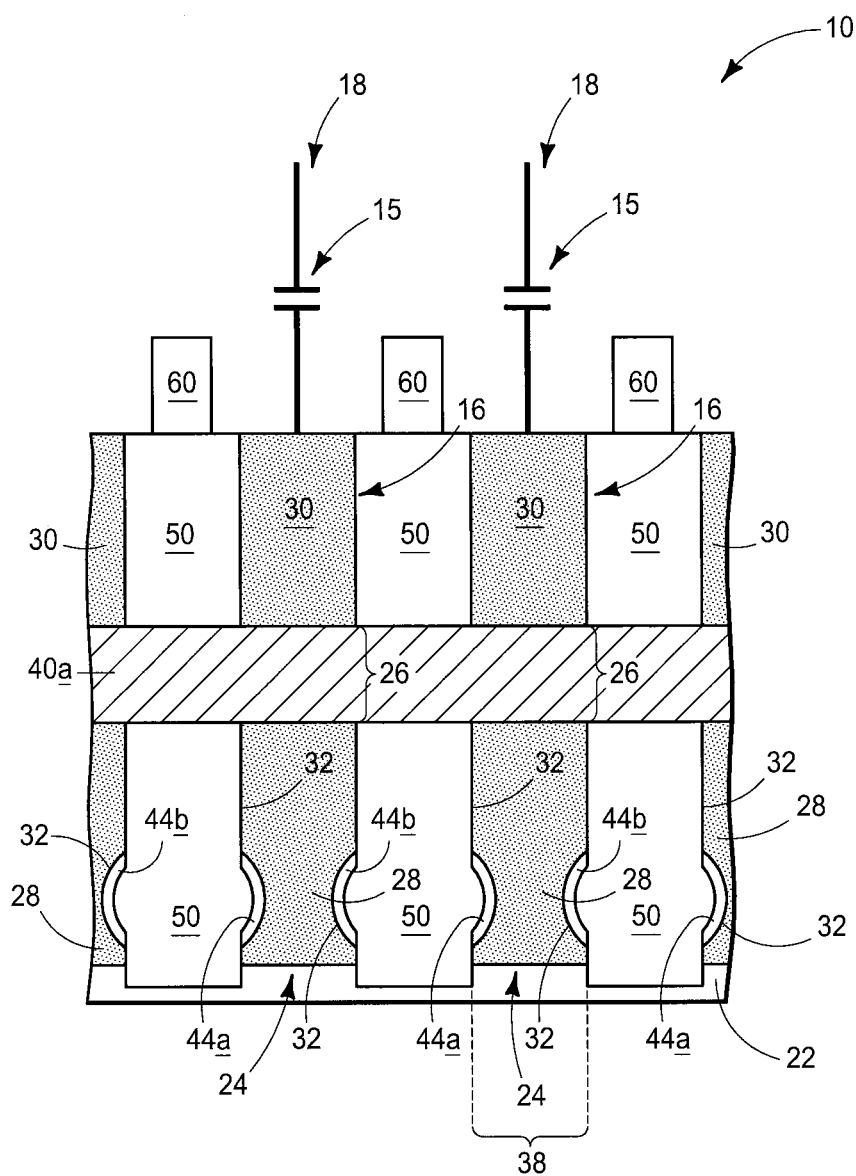
FIG. 3 is a hybrid schematic and structural cross-section view of the substrate fragment of FIG. 1, and taken through line 3-3 in FIG. 1.

Substrate fragment 10 comprises substrate material 22 which may be homogenous or non-homogenous, and may comprise multiple different composition materials, regions, and/or layers. Example materials include semiconductor material, for example bulk monocrystalline silicon lightly background doped with a p-type conductivity modifying impurity. Other semiconductor materials, including semiconductor-on-insulator substrates, may also be used. In some embodiments and as shown, vertically-oriented transistors 16 are field-effect transistors. FIGS. 1-4 show individual transistors 16 as including semiconductor-comprising pedestals 24 having an elevationally outer source/drain region 30, an elevationally inner source/drain region 28, and a channel region 26 received elevationally between inner source/drain region 28 and outer source/drain region 30. Each may be homogenous or non-homogenous, with suitably doped semiconductive material (e.g., monocrystalline silicon) being examples. Specifically, inner and outer source/drain regions 28, 30, respectively, may comprise highest-doped concentration portions which are suitably conductively doped with a p or n-type conductivity modifying impurity, wherein channel region 26 may be doped with a lower concentration of the other of p or n-type impurity. Regardless, individual charge storage devices 15 may electrically couple to respective outer source/drain regions 30. In the context of this document, devices or components are electrically coupled relative one another if electric current continuously flows from one to the other predominately by movement of subatomic positive and/or negative charges when such are generated as opposed to predominately by movement of ions. For purposes of the continuing discussion, inner source/drain region 28 may be considered as having opposing laterally outer sides 32 (FIG. 3). Further, channel region 26 may be considered as having opposing laterally outer sides 34 (FIG. 2), and in one embodiment which are transversally oriented relative to sides 32 of inner source/drain region 28.

Array 12 includes rows 36 of access lines and columns 38 of data/sense lines (FIG. 1). Use of "rows" and "columns" in this document is for convenience in distinguishing a series of access lines from a series of data/sense lines. Accordingly, "rows" and "columns" is intended to be synonymous with a series of access lines and a series of data/sense lines. The rows may be straight and/or curved and/or parallel and/or unparallel relative one another, as may be the columns. Further, the columns and rows may intersect relative one another at 90° or at other angles. In the depicted example embodiment, each of the rows and columns are shown as being individually straight, and angling relative one another at 90°.

Individual rows comprise an access line which interconnects transistors in that row. One access line or multiple access lines may be used which interconnect transistors in that row. Where multiple access lines are used, such lines may be electrically coupled relative one another. FIGS. 1-4 show individual rows 36 as comprising a pair of access lines 40a, 40b. In one embodiment and as shown, the access lines also form gates for individual field effect transistors, and therefore in some embodiments comprise access gate lines. One of the pair of access lines 40a, 40b is operatively laterally over one of laterally outer sides 34 of channel region 38, with the other of the pair of gate lines 40a, 40b being operatively laterally over the other of laterally outer sides 34 of channel region 30. A gate dielectric 42 is provided laterally between individual access gate lines 40a, 40b and respective channel portions 26. Access lines 40a, 40b may be homogenous or non-homogenous, may be of the same composition or of different compositions, and will comprise any suitably conductive material(s), for example any one or more of elemental metals, an alloy of elemental metals, a conductive metal compound, and conductively doped semiconductor material(s). Access lines 40a, 40b are shown to be rectangular in cross section, although any shape may be used. Further, each need not be of the same shape relative the other. Access lines 40a, 40b within individual rows 36 may be electrically coupled relative one another, for example as shown schematically via respective interconnects 41 (FIG. 1).

Individual columns comprise an inner data/sense line elevationally inward of the access lines and which interconnect transistors in that column. One data/sense line or multiple data/sense lines may be used elevationally inward of the access lines for interconnecting transistors in that column. FIGS. 1-4 show individual columns 38 comprising a pair of data/sense lines 44a, 44b elevationally inward of the access lines. One of the pair of data/sense lines 44a, 44b is shown electrically coupled to and against one of laterally outer sides 32 of inner source/drain regions 28, and the other of the pair of data/sense lines 44a, 44b is electrically coupled to and against the other of laterally outer sides 32 of inner source/drain regions 28. Data/sense lines 44a and 44b may be electrically coupled to one another other than solely through inner source/drain regions 28, for example as shown schematically via respective interconnects 45 (FIG. 1). Data/sense lines 44a, 44b may be homogenous or non-homogenous, and may be of the same composition or of different compositions relative one another. Example materials include those described above for access lines 40a, 40b. Data/sense lines 44a, 44b are shown to be arcuate and concave in cross-section, although any shape may be used. Further, each need not be of the same shape relative the other.

Dielectric material 50 is shown surrounding transistors 16, including access lines 40a, 40b, data/sense lines 44a, 44b, and semiconductor-comprising pedestals 24. Dielectric material 50 may be homogenous or non-homogenous, with silicon nitride and boron and/or phosphorous doped silicon dioxide being examples. Access gate lines 40a, 40b are shown with diagonal hatching for distinguishing clarity in FIG. 1, although such are received within dielectric material 50 as shown in FIGS. 2-4.

Individual columns comprise an outer data/sense line elevationally outward of the access lines and which electrically couples to the inner date/sense line in that column. One or more than one such outer data/sense line may be provided relative to individual columns, with one data/sense line 60 being shown per column 38 in the example FIGS. 1-4 embodiment. In one embodiment, outer data/sense lines 60 are elevationally outward of outer source/drain regions 30 of individual field effect transistors 16, and in one embodiment both elevationally and laterally outward of regions 30.

In one embodiment, the outer data/sense line is electrically coupled to the inner data/sense line at two or more spaced locations along the inner data/sense line, and in one embodiment is so electrically coupled proximate opposing ends of the array. FIGS. 1-4 depict an example embodiment wherein outer data/sense lines 60 individually couple to inner individual data/sense lines 44a, 44b at spaced locations 62 and 63 which are proximate two example opposing ends of array 12. Regardless, the electrical coupling may occur by means of a conductive via extending elevationally relative through dielectric 50. In the example FIGS. 1-4 embodiment, conductively doped semiconductive material-comprising pedestal 64 electrically couple outer data/sense line 60 to inner data/sense lines 44a, 44b at locations 62 and 63.

In one embodiment, the outer data/sense line is laterally displaced from the inner data/sense line within individual of the columns, and in one embodiment may also cross over the inner data/sense line within individual of the columns. The outer data/sense line may cross over the inner data/sense line at two or more spaced locations along the inner data/sense lines within individual of the columns. The outer data/sense line may cross over the inner data/sense line proximate at least one end of the array, and in one embodiment proximate opposing ends of the array, within individual of the columns. In one embodiment, the outer data/sense line is everywhere laterally displaced from the inner data/sense line within individual of the columns except where it crosses the inner data/sense line proximate at least one end of the array, for example as is shown in the embodiment of FIG. 1.

Outer data/sense line 60 may be homogenous or non-homogenous, and may comprise the same or different material(s) as the inner data/sense line(s). Example materials are any of those described above for the access lines. In one embodiment, the outer data/sense line is of higher conductivity than is the inner data/sense line. For example, inner data/sense lines may be fabricated of conductively doped semiconductive material, wherein the outer data/sense line may be fabricated of higher conductive metal(s) and/or metal compound(s). Such a construction may lower the overall resistance of the data/sense lines to sense amplifiers external of the array. Additionally, such a construction may lower the ratio of data/sense line-to-data/sense line capacitance to data/sense line-to-world capacitance, thus perhaps improving the final signal delivered to individual sense amplifiers.

In one embodiment, a memory array comprises a plurality of vertically-oriented transistors, rows of access lines, and rows of data/sense lines. Individual of the rows of access lines comprise multiple access lines and individual of the columns of data/sense lines comprise multiple data/sense lines. The number of data/sense lines in individual of the columns is larger than the number of access lines in individual of the rows. In one embodiment, the number of data/sense lines in individual of the columns is at least 3. In one embodiment, the number of data/sense lines in individual of the columns is one more than the number of access lines in individual of the rows. FIGS. 1-4 show an example embodiment wherein the number of data/sense lines in individual of the columns is 3 and the number of access lines in individual of the rows is 2.

In one embodiment, the data/sense lines in individual of the columns are of at least two different conductivity magnitudes relative one another. In one embodiment, at least one of the data/sense lines in individual of the columns is at a different elevation than another of the data/sense lines in that column, and in one embodiment wherein an elevationally outermost of the data/sense lines in individual of the columns is of highest conductivity compared to an elevationally inner of the data/sense lines in that column.

The above-described structures may be fabricated to any suitable architecture or size. In one example, individual memory cells of the above architecture may have $4F^2$ horizontally occupied area, where "F" is the minimum lateral feature dimension of the smallest feature that is formed using feature edges of a mask pattern that is received elevationally outward of material from which such smallest features are formed.

CONCLUSION

In some embodiments, an array comprises a plurality of vertically-oriented transistors, rows of access lines, and columns of data/sense lines. Individual of the rows comprise an access line interconnecting transistors in that row. Individual of the columns comprise an inner data/sense line elevationally inward of the access lines and interconnect transistors in that column. An outer data/sense line is elevationally outward of the access lines and is electrically coupled to the inner data/sense line.

In some embodiments, a memory array comprises a plurality of vertically-oriented transistors, rows of access lines, and columns of data/sense lines. Individual of the rows of access lines comprise multiple access lines and individual of the columns of data/sense lines comprise multiple data/sense lines. The number of data/sense lines in individual of the columns is larger than the number of access lines in individual of the rows.

In some embodiments, a memory cell comprises a vertically-oriented field effect transistor having an elevationally outer source/drain region, an elevationally inner source/drain region, and a channel region elevationally between the inner and outer source/drain regions. The channel region has opposing laterally outer sides, and the inner source/drain region has opposing laterally outer sides. An access gate line is operatively laterally over one of the laterally outer sides of the channel region. An inner data/sense line is elevationally inward of the access gate line. The inner data/sense line is electrically coupled to and against one of the laterally outer sides of the elevationally inner source/drain region. An outer data/sense line is elevationally outward of the access gate line and the outer source/drain region. The outer data/sense line is electrically coupled to the inner data/sense line. A charge storage device is electrically coupled to the elevationally outer source/drain region.

In some embodiments, a memory cell comprises a vertically-oriented field effect transistor having an elevationally outer source/drain region, an elevationally inner source/drain region, and a channel region elevationally between the inner and outer source/drain regions. The channel region has opposing laterally outer sides. The inner source/drain region has opposing laterally outer sides that are transversely oriented relative to the channel region laterally outer sides. The memory cell includes a pair of electrically coupled access gate lines. One of the pair of gate lines is operatively laterally over one of the laterally outer sides of the channel region. The other of the pair of gate lines is operatively laterally over the other of the laterally outer sides of the channel region. The memory cell includes a pair of inner electrically coupled data/sense lines elevationally inward of the pair of access gate lines. One of the pair of data/sense lines is electrically coupled to and against one of the laterally outer sides of the inner source/drain region. The other of the pair of data/sense lines is electrically coupled to and against the other of the laterally outer sides of the inner source/drain region. An outer data/sense line is elevationally outward of the pair of access gate lines and the outer source/drain region. The outer data/sense line is electrically coupled to the pair of inner data/sense lines. A charge storage device is electrically coupled to the elevationally outer source/drain region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array comprising a plurality of vertically-oriented transistors, the array comprising rows of access lines and columns of data/sense lines, the array comprising:

individual of the rows comprising an access line interconnecting transistors in that row; and individual of the columns comprising:
an inner data/sense line elevationally inward of the access lines, the inner data/sense line being longitudinally continuous and electrically coupling together all transistors in that column;
an outer data/sense line elevationally outward of the access lines and electrically coupled to the inner data/sense line; and
multiple inner data/sense lines elevationally inward of the access lines that individually are longitudinally continuous and electrically couple together all transistors in that column.

2. The array of claim 1 wherein individual of the vertically-oriented transistors include semiconductor-comprising pedestals which comprise an elevationally outer source/drain region and an elevationally inner source/drain region, the outer data/sense line extending longitudinally elevationally outward and laterally outward of the elevationally outer source/drain region.

3. The array of claim 1 wherein,
individual of the vertically-oriented transistors include semiconductor-comprising pedestals which comprise an elevationally outer source/drain region and an elevationally inner source/drain region; and
a conductively doped semiconductive material-comprising pedestal electrically coupling the outer data/sense line to at least one of the inner data/sense lines.

4. An array comprising a plurality of vertically-oriented transistors, the array comprising rows of access lines and columns of data/sense lines, the array comprising:
individual of the rows comprising an access line interconnecting transistors in that row, individual of the rows comprising multiple access lines interconnecting transistors in that row; and
individual of the columns comprising:
an inner data/sense line elevationally inward of the access lines, the inner data/sense line being longitudinally continuous and electrically coupling together all transistors in that column; and
an outer data/sense line elevationally outward of the access lines and electrically coupled to the inner data/sense line.

5. The array of claim 1 wherein individual of the columns comprise only one outer data/sense line elevationally outward of the access lines interconnecting transistors in that column.

6. An array comprising a plurality of vertically-oriented transistors, the array comprising rows of access lines and columns of data/sense lines, the array comprising:
individual of the rows comprising an access line interconnecting transistors in that row; and
individual of the columns comprising:
an inner data/sense line elevationally inward of the access lines and interconnecting transistors in that column lines; and
an outer data/sense line elevationally outward of the access lines and electrically coupled to the inner data/sense line, the outer data/sense line being laterally displaced from the inner data/sense line within individual of the columns, the outer data/sense line crossing over the inner data/sense line within individual of the columns.

7. The array of claim 6 wherein the outer data/sense line crosses over the inner data/sense line proximate at least one end of the array within individual of the columns.

8. The array of claim 7 wherein the outer data/sense line is everywhere laterally displaced from the inner data/sense line within individual of the columns except where it crosses the inner data/sense line proximate at least one end of the array.

9. The array of claim 6 wherein the outer data/sense line crosses over the inner data/sense line at two or more spaced locations along the inner data/sense line within individual of the columns.

10. The array of claim 9 wherein the outer data/sense line crosses over the inner data/sense line proximate opposing ends of the array within individual of the columns.

11. An array comprising a plurality of vertically-oriented transistors, the array comprising rows of access lines and columns of data/sense lines, the array comprising:
individual of the rows comprising an access line interconnecting transistors in that row; and
individual of the columns comprising:
an inner data/sense line elevationally inward of the access lines and interconnecting transistors in that column lines; and
an outer data/sense line elevationally outward of the access lines and electrically coupled to the inner data/sense line, the outer data/sense line being electrically coupled to the inner data/sense line at two or more spaced locations along the inner data/sense line.

12. The array of claim 11 wherein the outer data/sense line is electrically coupled to the inner data/sense line proximate opposing ends of the array.

13. The array of claim 1 wherein the array comprises a memory array comprising a charge storage device electrically coupled to an elevationally outer source/drain region of individual of the vertically-oriented transistors.

14. The array of claim 13 wherein the memory array comprises DRAM.

15. A memory array comprising a plurality of vertically-oriented transistors, rows of access lines, and columns of data/sense lines; individual of the rows of access lines comprising multiple access lines that are individually longitudinally continuous and electrically couple together all transistors in that row, individual of the columns of data/sense lines comprising multiple data/sense lines that are individually longitudinally continuous and electrically couple together all transistors in that column, the number of data/sense lines in individual of the columns being larger than the number of access lines in individual of the rows.

16. The array of claim 15 wherein the number of data/sense lines in individual of the columns is at least 3.

17. A memory array comprising a plurality of vertically-oriented transistors, rows of access lines, and columns of data/sense lines; individual of the rows of access lines comprising multiple access lines and individual of the columns of data/sense lines comprising multiple data/sense lines, the number of data/sense lines in individual of the columns being larger than the number of access lines in individual of the rows, the number of data/sense lines in individual of the columns being one more than the number of access lines in individual of the rows.

18. The array of claim 17 wherein the number of data/sense lines in individual of the columns is 3 and the number of access lines in individual of the rows is 2.

19. The array of claim 15 wherein the data/sense lines in individual of the columns are of at least two different conductivity magnitudes relative one another.

20. The array of claim 15 wherein at least one of the data/sense lines in individual of the columns is at a different elevation than another of the data/sense lines in that column.

21. The array of claim 20 wherein an elevationally outer-most of the data/sense lines in individual of the columns is of highest conductivity compared to elevationally inner of the data/sense lines in that column.

22. A memory cell comprising:
 a vertically-oriented field effect transistor having an elevationally outer source/drain region, an elevationally inner source/drain region, and a channel region elevationally between the inner and outer source/drain regions; the channel region having opposing laterally outer sides, the inner source/drain region having opposing laterally outer sides;
 an access gate line operatively laterally over one of the laterally outer sides of the channel region;
 an inner data/sense line elevationally inward of the access gate line, the inner data/sense line being electrically coupled to and against one of the laterally outer sides of the elevationally inner source/drain region;
 an outer data/sense line elevationally outward of the access gate line and the outer source/drain region, the outer data/sense line being electrically coupled to the inner data/sense line; and
 a charge storage device electrically coupled to the elevationally outer source/drain region.

23. A memory cell, comprising:
 a vertically-oriented field effect transistor having an elevationally outer source/drain region, an elevationally inner source/drain region, and a channel region elevationally between the inner and outer source/drain regions; the channel region having opposing laterally outer sides, the inner source/drain region having opposing laterally outer sides that are transversely oriented relative to the channel region laterally outer sides;
 a pair of electrically coupled access gate lines, one of the pair of gate lines being operatively laterally over one of the laterally outer sides of the channel region, the other of the pair of gate lines being operatively laterally over the other of the laterally outer sides of the channel region;
 a pair of inner electrically coupled data/sense lines elevationally inward of the pair of access gate lines, one of the pair of data/sense lines being electrically coupled to and against one of the laterally outer sides of the inner source/drain region, the other of the pair of data/sense lines being electrically coupled to and against the other of the laterally outer sides of the inner source/drain region;
 an outer data/sense line elevationally outward of the pair of access gate lines and the outer source/drain region, the outer data/sense line being electrically coupled to the pair of inner data/sense lines; and
 a charge storage device electrically coupled to the elevationally outer source/drain region.

24. An array comprising a plurality of vertically-oriented transistors, the array comprising rows of access lines and columns of data/sense lines, the array comprising:
 individual of the rows comprising an access line interconnecting transistors in that row; and
 individual of the columns comprising:
  an inner data/sense line elevationally inward of the access lines, the inner data/sense line being longitudinally continuous and electrically coupling together all transistors in that column; and
  an outer data/sense line elevationally outward of the access lines and electrically coupled to the inner data/sense line, the outer data/sense line being laterally displaced from the inner data/sense line within individual of the columns, the outer data/sense line crossing over the inner data/sense line within individual of the columns.

25. The array of claim 24 wherein the outer data/sense line crosses over the inner data/sense line proximate at least one end of the array within individual of the columns.

26. The array of claim 25 wherein the outer data/sense line is everywhere laterally displaced from the inner data/sense line within individual of the columns except where it crosses the inner data/sense line proximate at least one end of the array.

27. The array of claim 24 wherein the outer data/sense line crosses over the inner data/sense line at two or more spaced locations along the inner data/sense line within individual of the columns.

28. The array of claim 27 wherein the outer data/sense line crosses over the inner data/sense line proximate opposing ends of the array within individual of the columns.

* * * * *